(12) United States Patent
Nakamura et al.

(10) Patent No.: US 6,492,733 B2
(45) Date of Patent: Dec. 10, 2002

(54) LAMINATED ELECTRONIC COMPONENT

(75) Inventors: Akihiro Nakamura, Omihachiman (JP); Kunisaburo Tomono, Otsu (JP); Takashi Kodama, Otsu (JP); Takehiro Konoike, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/855,139

(22) Filed: May 14, 2001

(65) Prior Publication Data

US 2002/0005585 A1 Jan. 17, 2002

(30) Foreign Application Priority Data

May 12, 2000 (JP) ......................................... 2000-140143

(51) Int. Cl.[7] .............................................. H01L 23/48
(52) U.S. Cl. ...................................... 257/758; 257/781
(58) Field of Search ........................... 257/758; 361/321, 361/704; 336/84; 252/62.62; 438/107

(56) References Cited

U.S. PATENT DOCUMENTS 5,029,043 A * 7/1991 Kitahara .................... 361/321
5,206,620 A * 4/1993 Watanabe et al. ............. 336/84
5,711,893 A * 1/1998 Park ......................... 252/62.62
6,159,768 A * 12/2000 Ahn ........................... 438/107
6,160,469 A   12/2000 Liberatore et al.
6,301,114 B1 * 10/2001 Ootani ....................... 361/704

FOREIGN PATENT DOCUMENTS

| GB | 974853 | 11/1964 | |
| JP | 1228108 | 9/1989 | |
| JP | 9115730 | 5/1997 | |
| JP | 10126192 A * | 5/1998 | ........... H01F/17/00 |

* cited by examiner

*Primary Examiner*—David Nelms
*Assistant Examiner*—Thinh Nguyen
(74) *Attorney, Agent, or Firm*—Ostrolenk, Faber, Gerb & Soffen, LLP

(57) ABSTRACT

A laminated electronic component includes a composite obtained by integrally sintering a plurality of laminated magnetic layers, internal conductors being formed in the interior of the composite. The internal conductor and the magnetic layers constitute a plurality of inductance elements, or an inductance element and a capacitance element. The magnetic layer has a composition containing a primary component comprising 45 to 50 mole percent $Fe_2O_3$, 0 to 33 mole percent ZnO, and 6 to 20 mole percent CuO, and the balance being NiO, and a Mn compound wherein the Mn compound is contained in an amount of 0.01 to 2.0 weight percent as MnO in the composition.

5 Claims, 2 Drawing Sheets

LAMINATED ELECTRONIC COMPONENT

BACKGROUND OF THE INVENTION

1. Field of the Invention

The present invention relates to laminated electronic components, and specifically a laminated electronic component comprising a composite obtained by integrally sintering a plurality of laminated magnetic layers in which a plurality of inductance elements, or an inductance element and a capacitance element are constituted in the interior of the composite.

2. Description of the Related Art

Various ferrite materials have been used as various magnetic core materials or materials for constituting laminated electronic components such as monolithic inductors owing to excellent electrophotographic characteristics.

In particular, in laminated electronic components such as monolithic inductors, silver or a material primarily composed of silver is used as a material for internal conductors; hence, magnetic layers constituting composites provided in the laminated electronic components must be simultaneously sinterable with Ag contained in the internal conductors. Thus, Ni—Cu—Zn-based ferrite materials, which can be sintered at a temperature below the melting point (960° C.) of Ag, are generally used as ferrite materials constituting the magnetic layers.

In a laminated electronic component, such as a monolithic inductor, obtained by simultaneously sintering a plurality of laminated magnetic layers composed of a Ni—Cu—Zn-based ferrite material and internal conductors containing Ag, the internal conductors are covered by the magnetic layers, generating no leakage magnetic flux and suppressing crosstalk. Thus, this has advantages, such as applicability to high-density packaging and high robustness, and is used in various fields.

In recent years, with reduction in size and weight, higher performance, and functional versatility of various electronic devices, reduction in size and weight and higher performance are highly required for electronic components used in these electronic devices, and high reliability are also required for ensuring the performance.

Regarding reliability, it is important that various electronic devices maintain the properties at, for example, high temperature and high humidity, supposing the use in various environments.

When a conventional ferrite material is, however, used in laminated electronic components having structures which generate potential differences, such as a laminated electronic component constituting a plurality of inductance elements or an inductance element and a capacitance element, migration of the internal conductor readily occurs and insulating resistance readily decreases in use under severe environments such as high temperature and high humidity, as described above.

SUMMARY OF THE INVENTION

It is an object of the present invention to provide a laminated electronic component which can solve the above-mentioned problems.

The present invention is directed to a laminated electronic component comprising a composite obtained by integrally sintering a plurality of laminated magnetic layers, an internal conductor being formed in the interior of the composite, the internal conductor and the magnetic layers constituting, at least one electrical element, such as an inductor or a capacitor, or a plurality of electrical elements, such as a plurality of inductance elements, or an inductance element and a capacitance element. In order to solve the above-mentioned technical problems, briefly speaking, it is characterized in that a specific amount of Mn compound is contained in a Ni—Cu—Zn ferrite which is the primary component in the composition of the magnetic layer.

In particular, the magnetic layers are characterized by having a primary component comprising 45 to 50 mole percent $Fe_2O_3$, 0 to 33 mole percent ZnO, and 6 to 20 mole percent CuO, and the balance being NiO, and a Mn compound wherein the Mn compound is contained in an amount of 0.01 to 2.0 weight percent as MnO in the composition.

The present invention is particularly advantageously applicable when the internal conductors contain Ag.

The laminated electronic component in accordance with the present invention can have various specific structures. For example, in the laminated electronic component, the internal conductor is provided with a plurality of internal conductors and a plurality of external terminal electrodes, each is electrically connected to each end of each of the plurality of internal conductors on outer surfaces of the composite. Alternatively, the internal conductor is provided with an internal conductor and at least one pair of opposing capacitor electrodes.

According to the present invention, as described above, a Mn compound is contained in an amount of 0.01 to 2.0 weight percent as MnO in the composition of the magnetic layer; hence, migration barely occurs when Ag is used in internal conductors, a superior sintered state is achieved at a firing temperature which enables simultaneous sintering with the Ag-containing internal conductors, and a monolithic electronic composite having superior reliability at high temperature and high humidity is thereby obtainable.

Accordingly, the present invention can be applied to monolithic electronic components provided with a plurality of inductance elements, for example, a monolithic electronic component in which an internal conductor is provided with a plurality of inductance conductors and a plurality of external terminal electrodes electrically connected to both ends of each of the plurality of inductance conductors, or monolithic electronic components provided with inductance elements and capacitance elements, for example, a monolithic electronic component in which an internal conductor is provided with an inductance conductor and at least one pair of opposing capacitor electrodes.

For the purpose of illustrating the invention, there is shown in the drawings several forms which are presently preferred, it being understood, however, that the invention is not limited to the precise arrangements and instrumentalities shown.

Other features and advantages of the present invention will become apparent from the following description of the invention which refers to the accompanying drawings.

BRIEF DESCRIPTION OF THE DRAWING(S)

FIG. 1 is an isometric view illustrating an appearance of an inductor array 1 as a laminated electronic component according to an embodiment of the present invention.

FIG. 2 is a plan view illustrating an internal structure of a composite 2 provided in the inductor array 1 shown in FIG. 1 and shows a cross-section along a specific interface between a plurality of magnetic layers 3 constituting the composite 2.

DETAILED DESCRIPTION OF EMBODIMENTS OF THE INVENTION

Hereinafter, the preferred embodiments of the present invention are explained in detail with reference to the drawings.

Figure 1:
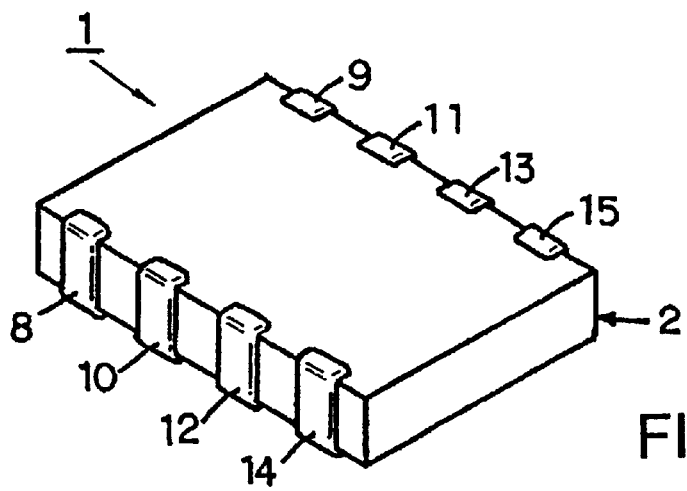
Figure 2:
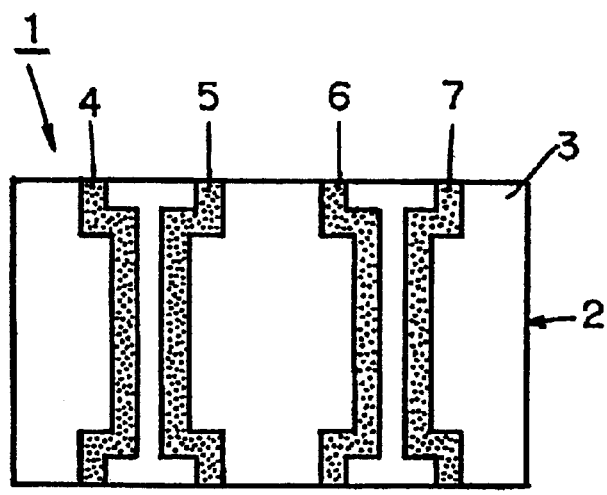

FIG. 1 is a perspective view illustrating an appearance of an inductor array 1 as a laminated electronic component according to an embodiment of the present invention. The inductor array 1 is provided with a composite 2. FIG. 2 is a plan view illustrating the internal structure of the composite 2 shown in FIG. 1 and illustrates a cross-section along a specific interface between a plurality of magnetic layers 3 constituting the composite 2.

The composite 2 is obtained by laminating and by integrally sintering the plurality of magnetic layers 3 shown in FIG. 2.

The inductor array 1 constitutes a plurality of inductance elements, and inductance conductors 4, 5, 6, and 7 as internal conductors are formed in the interior of the composite 2. These inductance conductors 4 to 7 substantially linearly extend parallel to each other along the interface between the magnetic layers 3 in the interior of the composite 2.

Furthermore, external terminal electrodes 8, 9, 10, 11, 12, 13, 14 and 15 are provided so as to be connected to both ends of each of the inductance conductors 4 to 7.

Figure 3:
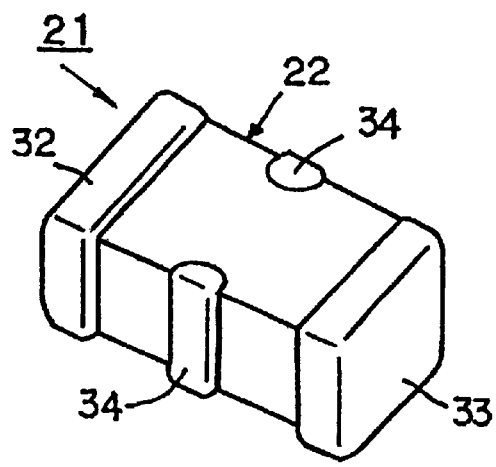
FIG. 3 is an isometric view illustrating an appearance of a LC filter 21 as a laminated electronic component according to another embodiment of the present invention.
Figure 4:
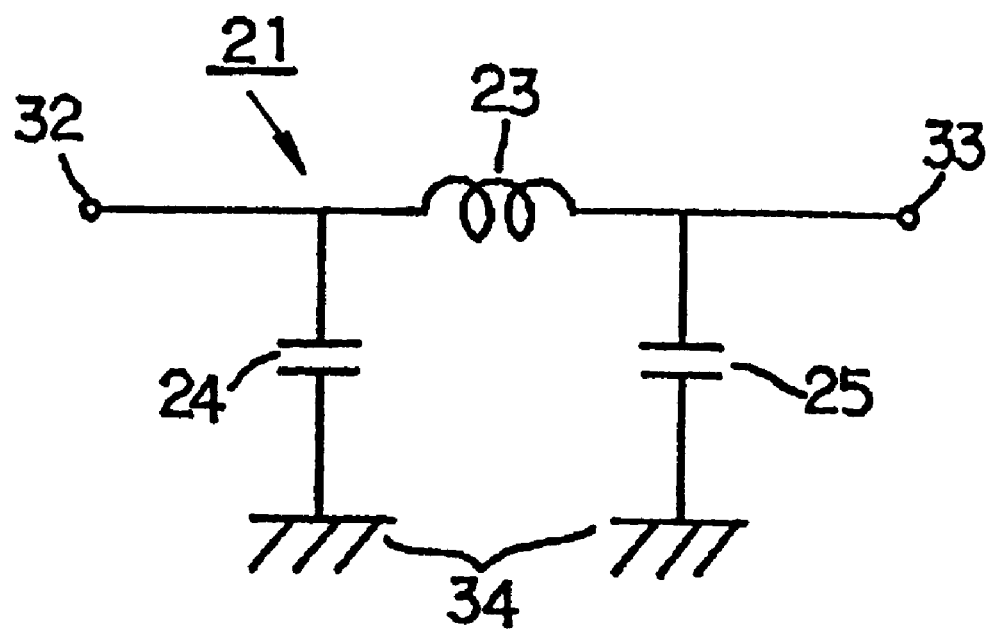
FIG. 4 is an equivalent circuit diagram of the LC filter 21 shown in FIG. 3.
Figure 5:
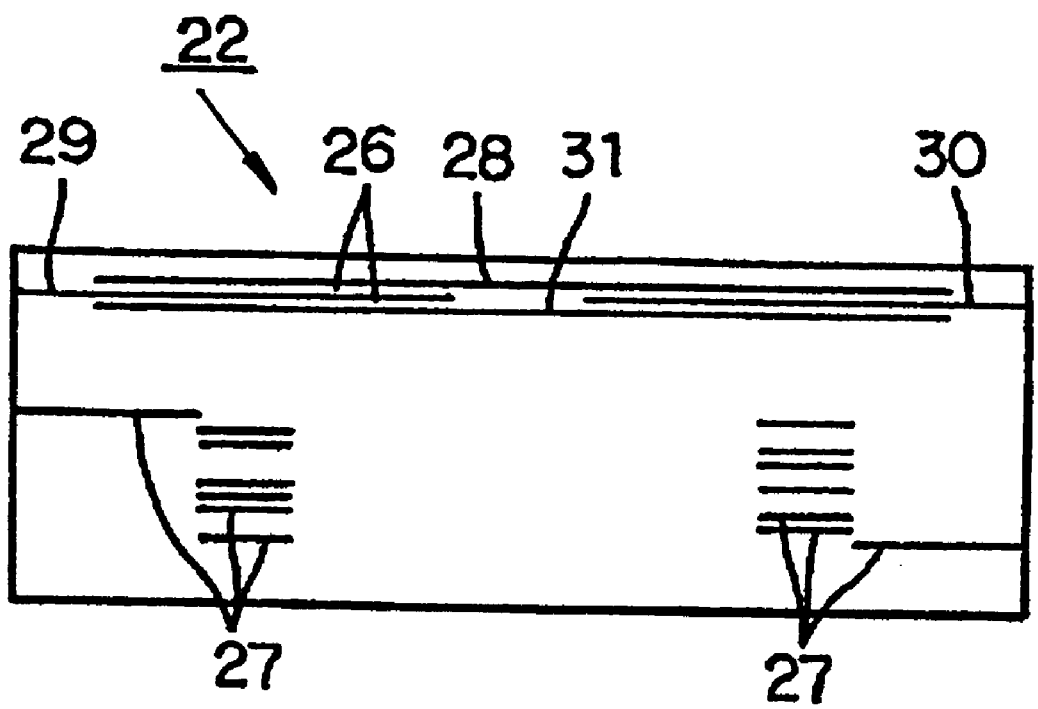
FIG. 5 is a cross-sectional view of a composite 22 provided in the LC filter 21 shown in FIG. 3.

FIG. 3 is an isometric view illustrating an appearance of an LC filter 21 as a laminated electronic component according to another embodiment of the present invention. FIG. 4 is an equivalent circuit diagram of the LC filter 21 shown in FIG. 3. As shown in FIG. 3, the LC filter 21 is provided with a composite 22. FIG. 5 is a cross-sectional view of the composite 22.

As shown in FIG. 4, this LC filter 21 includes an inductance element 23 and two capacitance elements 24 and 25.

The composite 22 is, as shown in FIG. 5, obtained by integrally sintering a plurality of laminated magnetic layers 26.

Inductance conductors 27 are formed as internal conductors in the interior of the composite 22. The inductance conductors 27 extend, as shown in FIG. 5, over a plurality of magnetic layers 26, and conductive films shown in the drawing and via hole conductors not shown in the drawing are connected to each other to form a coil shape as a whole. The inductance conductors 27 and the relevant magnetic layers 26 provide the above-mentioned inductance element 23.

Moreover, at least one pair of capacitor electrodes 28, 29, 30, and 31 are formed as internal conductors in the interior of the composite 22. These capacitor electrodes 28 to 31 and the relevant magnetic layers 26 provide the above capacitance elements 24 and 25.

In more detail, the capacitor electrodes 28 and 31 oppose both the capacitor electrodes 29 and 30. One capacitor element 24 is provided by opposition of the capacitor electrode 29 and the capacitor electrodes 28 and 30, the other capacitor element 25 is provided by opposition of the capacitor electrode 30 and the capacitor electrodes 28 and 31.

As shown in FIG. 3, external terminal electrodes 32 and 33 are provided on the opposing ends on the external surface of the composite 22. An external terminal electrode 34 is provided on a portion of at least one of the opposing side faces on the external surface of the composite 22. In this embodiment, two external terminal electrodes 34 are provided on the opposing two side faces.

One end of the above-described inductance conductor 27 and the capacitor electrode 28 are electrically connected to the external terminal electrode 32. The other end of the inductance conductor 27 and the capacitor electrode 30 are electrically connected to the external terminal electrode 33. Both the capacitors 28 and 31 are electrically connected to the external terminal electrodes 34.

The equivalent circuit shown in FIG. 4 is thereby provided by the LC filter 21.

In the magnetic layers 3 and 26 constituting the composites 2 and 22, respectively, provided in the inductor array 1 and the LC filter 21, respectively, the following composition may be employed.

The composition of the magnetic layers 3 and 26 is composed of $Fe_2O_3$, CuO, and NiO as primary components, and may contain ZnO, if necessary. In further detail, the primary components contain 45 to 50 mole percent $Fe_2O_3$, 0 to 33 mole percent ZnO (including 0 mole percent), 6 to 20 mole percent CuO, and the balance being NiO.

A $Fe_2O_3$ content of less than 45 mole percent results in reduced permeability, whereas a content exceeding 50 mole percent results in insufficient sintering. The $Fe_2O_3$ content is more preferably in the range of 47.5 to 49.8 mole percent.

An ZnO content exceeding 33 mole percent results in decreased magnetic characteristics in the temperature range in practical use due to a Curie temperature of 110° C. or less. The ZnO content is more preferably 0 to 31.0 mole percent.

A CuO content of less than 6 mole percent results in insufficient sintering, whereas a content exceeding 20 mole percent results in a reduced quality factor Q. The CuO content is more preferably 6.0 to 16.0 mole percent.

The composition of the magnetic layers 3 and 26 is characterized by addition of a Mn compound, as well as the above primary components. This Mn compound is added so that the composition contains 0.01 to 2.0 weight percent MnO. At a Mn compound content outside of this range, the initial insulating resistance and the insulating resistance after a predetermined time decrease.

In the above inductor array 1 and the LC filter 21, the conductive components of the inductance conductors 4 to 7 and the capacitor electrodes 28 to 31 as internal conductors are preferably composed of elemental Ag or a component primarily composed of Ag.

When Ag is used in the inductance conductors 4 to 7 and the capacitor electrodes 28 to 31, the temperature in a firing step for preparing the composites 2 and 22 is generally set to 850° C. to 950° C. for achieving simultaneous sintering. Thus, the magnetic layers 3 and 26 must have a composition which can be sufficiently sintered at such a sintering temperature to obtain desired magnetic characteristics and to maintain reliability.

By selecting the composition of the magnetic layers 3 and 26, as described above, satisfactory sintering is achieved at a firing temperature in the range of 850 to 950° C., migration of Ag contained in the inductance conductors 4 to 7 and the capacitor electrodes 28 to 31 barely occurs.

Thus, the insulating resistance between the plurality of inductance conductors 4 to 7 in the inductor array 1 shown in FIGS. 1 and 2 and the insulating resistance between the inductance conductor 27 and the capacitor electrodes 28 to 31 and between the individual capacitor electrodes 28 to 31 can be maintained at high levels, resulting in enhanced reliability in the inductor array 1 and the LC filter 21.

The present invention can be applied to, not only the monolithic electronic components such as the inductor array 1 and the LC filter 21 shown in the drawings, but also monolithic electronic components which have any structure and are provided with composites prepared by integrally firing a plurality of laminated magnetic layers in which internal conductors are formed in the composites, and the internal conductors and the magnetic layers constitute a plurality of inductance elements, or an inductance element and a capacitance element.

Experimental Examples performed for confirming the effects of the present invention will now be described.

EXPERIMENTAL EXAMPLES

1. Sample Preparation

Powdered MnO was added to $Fe_2O_3$, ZnO, CuO, and NiO weighed powdered oxide materials as primarily components, and the mixture was wet-mixed for 20 hours in a ball mill, dried, and calcined at 750° C. The calcined material was wet-pulverized for 24 hours in a ball mill, a binder was added to form a slurry, and a ferrite green sheet was prepared by a doctor blade process.

Using the ferrite green sheet, an inductor array which has substantially the same structure as that of the inductor array 1 shown in FIGS. 1 and 2 and a general monolithic capacitor were prepared.

In the inductor array, a plurality of inductance conductors containing an Ag conductive component was formed on the ferrite green sheet by printing, and another ferrite green sheet having no inductance conductors was laminated on the ferrite green sheet. The laminate was compacted to form a green composite. After the green composite was cut into a predetermined size, the cut green composite was fired at 920° C. for 2 hours to form a sintered composite. External terminal electrodes were formed on external surfaces of the composite to prepare an inductor array having a plurality of inductance elements.

In the monolithic capacitor, a capacitor electrode containing a Ag conductive component is formed by printing on each of a plurality of ferrite green sheets, the sheets were laminated, ferrite green sheets having no capacitor electrodes were laminated and compacted on the upper and lower surfaces of the laminate to form a green laminate. This green laminate was cut into a predetermined size and was fired at 920° C. for 2 hours to prepare a sintered laminate. External terminal electrodes were formed on the outer surfaces of the laminate to form a monolithic capacitor as a sample.

2. Reliability Testing

A moisture resistant loading test (temperature: 85° C., relative humidity: 85%, applied electric field intensity: 2 kV/mm) and a high-temperature loading test (temperature: 125° C., applied electric field intensity: 2 kV/mm) of the above inductor array and monolithic capacitor were performed to determine insulating resistances at some points between 0 to 2,000 hours.

In the inductor array, the above electric field was applied between the two adjacent inductance conductors. In the monolithic capacitor, the above electric field was applied between the opposing capacitor electrodes. The insulating resistance between the inductance conductors or capacitor electrodes in which the electric field was applied was measured while applying the same electric field.

3. Experimental Example 1

As magnetic materials contained in the above ferrite green sheet, various compositions containing 49.0 mole percent $Fe_2O_3$, 29.0 mole percent ZnO, 9.0 mole percent CuO, and 13 mole percent NiO, as primary components, and 0.005 to 3.0 weight percent MnO were used.

Examples 1 to 6 and Comparative Examples 1 and 2

Tables 1 and 2 show the results of evaluation of the insulating resistance by the humidity resistance loading test and the insulating resistance by the high-temperature loading test, respectively, of samples in accordance with the inductor array.

TABLE 1

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 1 | 0.005 | 8.6 | 8.6 | 8.5 | 6.8 | 5.7 |
| Example 1 | 0.01 | 9.3 | 9.3 | 9.3 | 9.3 | 9.2 |
| Example 2 | 0.05 | 10.4 | 10.4 | 10.4 | 10.4 | 10.4 |
| Example 3 | 0.2 | 11.5 | 11.5 | 11.5 | 11.5 | 11.5 |
| Example 4 | 0.5 | 11.2 | 11.2 | 11.2 | 11.2 | 11.1 |
| Example 5 | 1.0 | 10.8 | 10.8 | 10.8 | 10.7 | 10.8 |
| Example 6 | 2.0 | 9.5 | 9.5 | 9.5 | 9.5 | 9.3 |
| Comparative Example 2 | 3.0 | 8.0 | 7.7 | 5.3 | 4.8 | 4.2 |

TABLE 2

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 1 | 0.005 | 8.6 | 8.5 | 7.2 | 5.9 | 5.1 |
| Example 1 | 0.01 | 9.3 | 9.3 | 9.2 | 9.2 | 9.2 |
| Example 2 | 0.05 | 10.4 | 10.4 | 10.4 | 10.4 | 10.3 |
| Example 3 | 0.2 | 11.5 | 11.5 | 11.5 | 11.5 | 11.5 |
| Example 4 | 0.5 | 11.2 | 11.2 | 11.2 | 11.2 | 11.1 |
| Example 5 | 1.0 | 10.8 | 10.8 | 10.7 | 10.7 | 10.6 |
| Example 6 | 2.0 | 9.5 | 9.5 | 9.4 | 9.4 | 9.4 |
| Comparative Example 2 | 3.0 | 8.0 | 7.2 | 5.2 | 4.3 | 3.8 |

As shown in Tables 1 and 2, a decrease in the insulating resistance at high temperature and high humidity is suppressed according to Examples 1 to 6 in which the Mn content is within the range of 0.01 to 2.0 weight percent, obtaining inductor arrays having superior insulating reliability.

Examples 7 to 12 and Comparative Examples 3 and 4

Tables 3 and 4 show the results of evaluation of the insulating resistance by the humidity resistance loading test and the insulating resistance by the high-temperature loading test, respectively, of samples in accordance with the monolithic capacitor.

TABLE 3

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 3 | 0.005 | 8.2 | 8.2 | 8.0 | 6.6 | 5.4 |
| Example 7 | 0.01 | 9.0 | 9.0 | 9.0 | 9.0 | 8.9 |
| Example 8 | 0.05 | 10.2 | 10.2 | 10.2 | 10.2 | 10.2 |
| Example 9 | 0.2 | 11.1 | 11.1 | 11.1 | 11.1 | 11.1 |
| Example 10 | 0.5 | 10.8 | 10.8 | 10.8 | 10.8 | 10.7 |
| Example 11 | 1.0 | 10.3 | 10.3 | 10.3 | 10.2 | 10.2 |
| Example 12 | 2.0 | 9.1 | 9.1 | 9.1 | 9.0 | 8.9 |
| Comparative Example 4 | 3.0 | 7.6 | 7.3 | 5.2 | 4.4 | 4.0 |

TABLE 4

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 3 | 0.005 | 8.2 | 8.1 | 7.1 | 5.5 | 4.7 |
| Example 7 | 0.01 | 9.0 | 9.0 | 8.9 | 8.9 | 8.9 |
| Example 8 | 0.05 | 10.2 | 10.2 | 10.2 | 10.2 | 10.1 |
| Example 9 | 0.2 | 11.1 | 11.1 | 11.1 | 11.1 | 11.1 |
| Example 10 | 0.5 | 10.8 | 10.8 | 10.8 | 10.8 | 10.7 |
| Example 11 | 1.0 | 10.3 | 10.3 | 10.2 | 10.2 | 10.1 |
| Example 12 | 2.0 | 9.1 | 9.1 | 9.1 | 9.0 | 9.0 |
| Comparative Example 4 | 3.0 | 7.6 | 6.8 | 5.0 | 4.2 | 3.6 |

As shown in Tables 3 and 4, a decrease in the insulating resistance at high temperature and high humidity is suppressed according to Examples 7 to 12 in which the Mn content is within the range of 0.01 to 2.0 weight percent, obtaining monolithic capacitors having superior insulating reliability.

4. Experimental Example 2

As magnetic materials contained in the above ferrite green sheet, various compositions containing 47.0 mole percent $Fe_2O_3$, 12.0 mole percent ZnO, 12.0 mole percent CuO, and 29 mole percent NiO, as primary components, and 0.005 to 3.0 weight percent MnO were used.

Examples 13 to 18 and Comparative Examples 5 and 6

Tables 5 and 6 show the results of evaluation of the insulating resistance by the humidity resistance loading test and the insulating resistance by the high-temperature loading test, respectively, of samples in accordance with the inductor array.

TABLE 5

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 5 | 0.005 | 7.7 | 7.7 | 7.5 | 6.3 | 5.3 |
| Example 13 | 0.01 | 8.5 | 8.5 | 8.5 | 8.4 | 8.4 |
| Example 14 | 0.05 | 9.7 | 9.7 | 9.7 | 9.7 | 9.6 |
| Example 15 | 0.2 | 10.3 | 10.3 | 10.3 | 10.3 | 10.3 |
| Example 16 | 0.5 | 10.6 | 10.6 | 10.6 | 10.6 | 10.6 |
| Example 17 | 1.0 | 9.9 | 9.9 | 9.9 | 9.8 | 9.8 |

TABLE 5-continued

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Example 18 | 2.0 | 8.6 | 8.6 | 8.5 | 8.5 | 8.4 |
| Comparative Example 6 | 3.0 | 7.1 | 6.7 | 5.2 | 4.6 | 4.2 |

TABLE 6

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 5 | 0.005 | 7.7 | 7.5 | 6.7 | 5.3 | 4.6 |
| Example 13 | 0.01 | 8.5 | 8.5 | 8.4 | 8.4 | 8.3 |
| Example 14 | 0.05 | 9.7 | 9.7 | 9.7 | 9.6 | 9.6 |
| Example 15 | 0.2 | 10.3 | 10.3 | 10.3 | 10.3 | 10.2 |
| Example 16 | 0.5 | 10.6 | 10.6 | 10.6 | 10.6 | 10.6 |
| Example 17 | 1.0 | 9.9 | 9.9 | 9.8 | 9.8 | 9.7 |
| Example 18 | 2.0 | 8.6 | 8.6 | 8.5 | 8.4 | 8.4 |
| Comparative Example 6 | 3.0 | 7.1 | 6.3 | 5.2 | 4.1 | 3.6 |

As shown in Tables 5 and 6, a decrease in the insulating resistance at high temperature and high humidity is suppressed according to Examples 13 to 18 in which the Mn content is within the range of 0.01 to 2.0 weight percent, obtaining inductor arrays having superior insulating reliability.

Examples 19 to 24 and Comparative Examples 7 and 8

Tables 7 and 8 show the results of evaluation of the insulating resistance by the humidity resistance loading test and the insulating resistance by the high-temperature loading test, respectively, of samples in accordance with the monolithic capacitor.

TABLE 7

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 7 | 0.005 | 7.3 | 7.2 | 7.0 | 5.9 | 5.1 |
| Example 19 | 0.01 | 8.1 | 8.1 | 8.0 | 8.0 | 7.9 |
| Example 20 | 0.05 | 9.3 | 9.3 | 9.3 | 9.2 | 9.2 |
| Example 21 | 0.2 | 9.9 | 9.9 | 9.9 | 9.9 | 9.8 |
| Example 22 | 0.5 | 10.2 | 10.2 | 10.2 | 10.2 | 10.2 |
| Example 23 | 1.0 | 9.5 | 9.5 | 9.4 | 9.3 | 9.3 |
| Example 24 | 2.0 | 8.2 | 8.2 | 8.1 | 8.0 | 8.0 |
| Comparative Example 8 | 3.0 | 6.9 | 6.6 | 5.1 | 4.3 | 3.5 |

TABLE 8

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Comparative Example 7 | 0.005 | 7.3 | 7.1 | 6.4 | 5.2 | 4.4 |
| Example 19 | 0.01 | 8.1 | 8.0 | 8.0 | 7.9 | 7.9 |
| Example 20 | 0.05 | 9.3 | 9.3 | 9.2 | 9.2 | 9.2 |

TABLE 8-continued

| | MnO content (wt %) | Resistance <log ρ> (Ω) | | | | |
|---|---|---|---|---|---|---|
| | | Initial (0 hr.) | 100 hr. | 500 hr. | 1000 hr. | 2000 hr, |
| Example 21 | 0.2 | 9.9 | 9.9 | 9.9 | 9.8 | 9.8 |
| Example 22 | 0.5 | 10.2 | 10.2 | 10.2 | 10.2 | 10.1 |
| Example 23 | 1.0 | 9.5 | 9.4 | 9.4 | 9.4 | 9.3 |
| Example 24 | 2.0 | 8.2 | 8.1 | 8.1 | 8.0 | 8.0 |
| Comparative Example 8 | 3.0 | 6.9 | 6.2 | 5.0 | 4.1 | 3.3 |

As shown in Tables 7 and 8, a decrease in the insulating resistance at high temperature and high humidity is suppressed according to Examples 19 to 24 in which the Mn content is within the range of 0.01 to 2.0 weight percent, obtaining monolithic capacitors having superior insulating reliability.

In the above Experimental Examples, a decrease in insulating resistance between the inductance element and the capacitance element was not evaluated. However, it is obviously understood that substantially the same results as those in the case of the insulating resistance between a plurality of inductance electrodes or the insulating resistance between a plurality of capacitance electrodes will be obtained.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A laminated electronic component comprising a composite obtained by integrally sintering a plurality of laminated magnetic layers, internal conductors being formed in the interior of the composite, the internal conductors and the magnetic layers constituting a plurality of inductance elements, or an inductance element and a capacitance element, potential differences being located between internal conductors having a potential difference;

wherein the magnetic layer has a composition containing a primary component comprising 45 to 50 mole percent $Fe_2O_3$, 0 to 33 mole percent ZnO, and 6 to 20 mole percent CuO, and the balance being NiO, and a Mn compound wherein the Mn compound is contained in an amount of 0.01 to 2.0 weight percent as MnO in the composition.

2. A laminated electronic component according to claim 1, wherein the internal conductors comprise Ag.

3. A laminated electronic component according to claim 1 or 2, wherein the internal conductors constitute a plurality of inductance elements, and a plurality of external electrodes are connected to opposite ends of each of the plurality of inductance elements, each of the external electrodes being provided on an external surface of the composite.

4. A laminated electronic component according to claim 1 or 2, wherein the internal conductors comprise an inductance element and at least one pair of opposing capacitor electrodes.

5. A laminated electronic component according to claim 4, wherein opposite ends of the inductance element are connected to first and second external electrode and opposite ends of one of the opposing capacitor electrodes are connected to the first external electrode and a third external electrode, respectively, and opposing ends of the other of the opposing capacitor electrodes are connected to the second external electrode and a fourth external electrode, respectively, the first, second, third and fourth external electrodes being provided on an external surface of the composite.

* * * * *